United States Patent
Wei et al.

(10) Patent No.: US 11,349,438 B2
(45) Date of Patent: May 31, 2022

(54) POWER AMPLIFIER PACKAGES CONTAINING MULTI-PATH INTEGRATED PASSIVE DEVICES

(71) Applicant: NXP USA, Inc., Austin, TX (US)

(72) Inventors: Yun Wei, Chandler, AZ (US); Ricardo Uscola, Tempe, AZ (US); Monte G. Miller, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 324 days.

(21) Appl. No.: 16/730,699

(22) Filed: Dec. 30, 2019

(65) Prior Publication Data

US 2021/0203278 A1 Jul. 1, 2021

(51) Int. Cl.
| | |
|---|---|
| *H03F 3/68* | (2006.01) |
| *H03F 1/02* | (2006.01) |
| *H01L 23/00* | (2006.01) |
| *H03F 3/195* | (2006.01) |
| *H03F 3/21* | (2006.01) |

(52) U.S. Cl.
CPC .......... *H03F 1/0288* (2013.01); *H01L 24/49* (2013.01); *H01L 24/85* (2013.01); *H03F 3/195* (2013.01);
(Continued)

(58) Field of Classification Search
CPC .. H03F 1/0288; H03F 3/195; H03F 2200/222; H03F 3/211; H03F 2200/451; H03F 3/602; H03F 3/604; H01L 24/49; H01L 24/85; H01L 2223/6611; H01L 2223/6655; H01L 2223/6661; H01L 24/48; H01L 23/66; H01L 2223/6644;
(Continued)

(56) References Cited

U.S. PATENT DOCUMENTS

| | | | |
|---|---|---|---|
| 9,337,774 B2 * | 5/2016 | Szymanowski | ......... H01L 24/49 |
| 9,450,547 B2 | 9/2016 | Szymanowski et al. | |

(Continued)

FOREIGN PATENT DOCUMENTS

EP 3247038 A1 11/2017

OTHER PUBLICATIONS

Min, Seungkee et al., "A 20W and Broadband Two-stage LDMOS Power Amplifier with High-Q Cu Integrated Passive Device for Multi-Band and Multi-Standard Applications", Proceedings of the 46th European Microwave Conference, Oct. 4, 2016, pp. 1449-1452, IEEE, Piscataway, NJ, USA.

(Continued)

*Primary Examiner* — Khanh V Nguyen

(57) ABSTRACT

Power amplifier (PA) packages, such as Doherty PA packages, containing multi-path integrated passive devices (IPDs) are disclosed. In embodiments, the PA package includes a package body through which first and second signal amplification paths extend, a first amplifier die within the package body and positioned in the first signal amplification path, and a second amplifier die within the package body and positioned in the second signal amplification path. A multi-path IPD is further contained in the package body. The multi-path IPD includes a first IPD region through which the first signal amplification path extends, a second IPD region through which the second signal amplification path extends, and an isolation region formed in the IPD substrate a location intermediate the first IPD region and the second IPD region.

20 Claims, 5 Drawing Sheets

(52) U.S. Cl.
CPC ............... *H01L 2223/6611* (2013.01); *H01L 2223/6655* (2013.01); *H01L 2223/6661* (2013.01); *H03F 3/211* (2013.01)

(58) Field of Classification Search
CPC ... H01L 2223/6672; H01L 2224/48091; H01L 2224/48137; H01L 2224/48139; H01L 2224/48195; H01L 2224/48247; H01L 2224/49175; H01L 2924/00014; H01L 2924/19011; H01L 23/552; H01L 25/16
USPC .............................. 330/124 R, 286, 295, 307
See application file for complete search history.

(56) References Cited

U.S. PATENT DOCUMENTS

| | | | |
|---|---|---|---|
| 9,503,030 B2 * | 11/2016 | Blednov | ................ H03F 3/195 |
| 9,589,927 B2 * | 3/2017 | Szymanowski | ....... H01L 23/481 |
| 9,986,646 B2 * | 5/2018 | Viswanathan | ........ H03F 1/0288 |
| 2011/0062549 A1 | 3/2011 | Lin | |
| 2015/0002226 A1 | 1/2015 | Meen Kuo et al. | |
| 2015/0002229 A1 | 1/2015 | Kuo et al. | |
| 2016/0211222 A1 | 7/2016 | Kuo et al. | |
| 2016/0380606 A1 | 12/2016 | Limjoco et al. | |
| 2017/0117239 A1 | 4/2017 | Lembeye et al. | |
| 2018/0175802 A1 | 6/2018 | Wu et al. | |

OTHER PUBLICATIONS

Zhu, Ning et al., "Compact High-Efficiency High-Power Wideband GaN Amplifier Supporting 395 MHz Instantaneous Bandwidth", 2019 IEEE MTT-S International Microwave Symposium, Jun. 2, 2019, pp. 1175-1178, IEEE, Piscataway, NJ, USA.

* cited by examiner

POWER AMPLIFIER PACKAGES CONTAINING MULTI-PATH INTEGRATED PASSIVE DEVICES

TECHNICAL FIELD

Embodiments of the present disclosure relate generally to microelectronics and, more particularly, to power amplifier (PA) packages, such as small footprint Doherty PA packages, containing multi-path integrated passive devices.

Abbreviations

Abbreviations appearing relatively infrequently in this document are defined upon initial usage, while abbreviations appearing more frequently in this document are defined below:
FET—field effect transistor;
IPD—integrated passive device;
MN—matching network;
PA—power amplifier; and
PCB—printed circuit board.

BACKGROUND

By common design, a Doherty PA package contains a peaking amplifier die and a carrier amplifier die. The peaking and carrier amplifier dies are mounted to a package substrate, such as an electrically-conductive base flange, which may serve as a ground terminal of the package when the power amplifiers are implemented utilizing FETs. A Doherty PA package also commonly contains a carrier input impedance MN, a carrier output impedance MN, a peaking input impedance MN, and a peaking output impedance MN, which are interconnected with neighboring circuit components with the package body. Device designers are challenged to include all of the necessary MN circuitry into a single device package as the industry trend continues toward increased miniaturization.

BRIEF DESCRIPTION OF THE DRAWINGS

At least one example of the present invention will hereinafter be described in conjunction with the following figures, wherein like numerals denote like elements, and.

Figure 1:
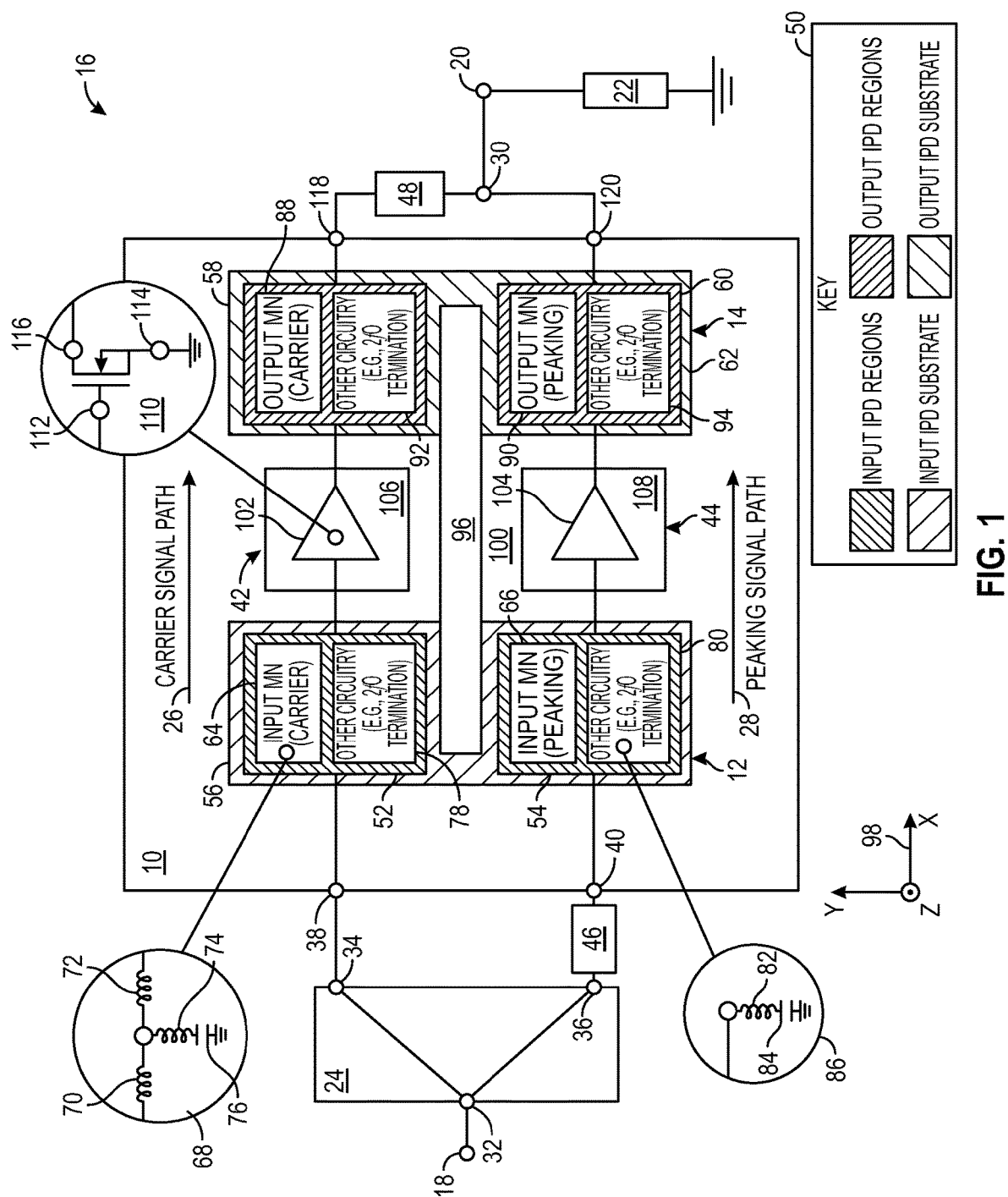
FIG. 1 is a simplified schematic diagram of a Doherty PA package implemented utilizing input and output multi-path IPDs, as illustrated in accordance with an example embodiment of the present disclosure.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

As appearing herein, the term "multi-path IPD" refers to an integrated passive device (IPD) structure including different regions or blocks of circuitry formed in a common substrate. At least two electrically-isolated signal amplifications paths extend in parallel through a multi-path IPD: a carrier signal amplification path and a peaking signal amplification path (noting that signal amplification is accomplished external to the multi-path IPD). The substrate of the multi-path IPD spans the space between the carrier signal amplification path and a peaking signal amplification path. When integrated into a two way Doherty PA package, a given multi-path IPD may include first and second electrically-isolated circuit regions through which a carrier signal amplification path and a peaking signal amplification path extend, respectively. In this case, the multi-path IPD may be more specifically referred to as a "dual path IPD." In other implementations, such as when a given multi-path IPD is contained within an N-way Doherty PA package (N>2), the multi-path IPD may include three or more electrically-isolated circuit regions or blocks through which an equal number of signal amplification paths extend.

Overview

The following describes PA packages containing multi-path IPDs and other unique structural features, which enable reductions in package footprint, lowered manufacturing costs, and enhanced isolation performance in various embodiments. In many instances, the PA packages described herein are implemented as Doherty PA packages and are consequently principally described below as such. It is, however, emphasized that following disclosure is equally applicable to other types of PA packages including, for example, push-pull-type PA packages. Further, while principally described below as containing two multi-path IPDs (namely, one input multi-path IPD and one output multi-path IPD), the below-described PA packages need not contain two multi-path IPDs in all implementations. Rather, the PA package may include a single multi-path input IPD in combination with a discrete (single path) carrier output IPD and a discrete (single path) peaking output IPD in embodiments. Conversely, other embodiments of the PA package may contain a single multi-path output IPD in combination with a discrete (single path) carrier input IPD and a discrete (single path) peaking output IPD. In still other instances, embodiments of the PA package may contain a single multi-path IPD on a first side (the output side or the input side) of the amplifier dies, while lacking in-package impedance MN circuitry on the second side of the amplifier dies—in which case the desired impedance matching may be accomplished by circuitry outside of the PA package, such circuitry as on a PCB included in a larger PA circuit or system into which the PA package is integrated.

In various implementations, the Doherty PA package contains an input multi-path IPD including a carrier IPD region or block and a peaking IPD region or block. As indicated above, the carrier IPD region and the peaking IPD region are electrically-isolated and, specifically, may be separated by an intervening isolation region. The IPD regions each contain circuitry supporting input side or output side impedance matching of the power amplifier dies. For example, in the case of an input multi-path IPD, the input carrier IPD region contains circuitry that, in combination with corresponding bond wires (or other electrical interconnects), forms a carrier input impedance MN for raising the impedance of the carrier signal applied to the input terminal (e.g., a gate terminal) of the carrier amplifier to a desired level. Similarly, the input peaking IPD region contains circuitry that, in combination with other circuit elements (e.g., bond wires or other inductive elements), forms a peaking input impedance MN for raising the impedance of the peaking signal applied to the input terminal of the peaking amplifier. The circuitry defining the input carrier IPD region and the circuitry defining the input peaking IPD region are formed at different locations in a common substrate, such as a semiconductor die, a PCB, a ceramic substrate, or another type of substrate. So too is the intermediate isolation region formed in the common substrate at a location between carrier and peaking IPD regions. In instances in which the input carrier IPD region, the input peaking IPD region, and the intermediate isolation region are formed in a semiconductor die, the semiconductor die may be referred herein to as an "input multi-path IPD die."

In addition to or in lieu of an input multi-path IPD, the Doherty PA package may contain an output multi-path IPD. Again, such an output multi-path IPD may contain: (i) a first circuit block or IPD region forming, in combination with bond wires (or other circuit elements), a carrier output impedance MN; (ii) a second circuit block or IPD region forming, in combination with bond wires (or other circuit elements), a peaking output impedance MN; and (iii) an isolation region between IPD regions. The carrier and peaking output impedance MNs function to raise the output impedance of the carrier and peaking amplifiers, respectively, to a level more closely matched to impedance of an electrical load, such as an antenna, coupled to the output of a larger Doherty PA circuit or system containing the Doherty PA package. The output carrier IPD region and the output peaking IPD region are formed in a common substrate, such as a semiconductor die, a ceramic substrate, or a PCB, along with the intermediate isolation region. When these regions are formed in a common semiconductor die, the semiconductor die may be referred to as an "output multi-path IPD die" in keeping with the terminology introduced above.

Comparatively, when implemented utilizing a PCB, the output carrier and peaking IPD regions may be formed in a different PCB than are the input carrier and peaking IPD regions (when present); or, instead, the output carrier and peaking IPD regions may be formed in first section of a PCB, while the input carrier and peaking IPD regions are formed in a second section of the same PCB. In this latter instance, the PCB may be shaped to avoid interference with direct mounting of the power amplifier dies to the package substrate in embodiments; e.g., the PCB may have a generally U-shaped or ring-shaped planform geometry defining a central opening within which the power amplifier dies are attached to the package substrate in the form of an electrically-conductive base flange.

In embodiments of the Doherty PA package, the input multi-path IPD and/or the output multi-path IPD may be produced to contain circuitry supporting other functions in addition to the above-described impedance matching function. For example, in at least some implementations, either or both of the multi-path IPDs may be fabricated to include circuit elements supporting harmonic termination, baseband decoupling, and/or amplifier biasing, such as the biasing of transistor gate or drain terminals when the amplifiers are realized utilizing FETs. With respect to harmonic termination, in particular, termination of the second order harmonic on the input side of the carrier amplifier, on the output side of the carrier amplifier, on the input side of the peaking amplifier, and/or on the output side of the peaking amplifier may be beneficially provided by fabricating the appropriate IPD region(s) to include circuitry for this purpose; e.g., a shunt capacitor formed in or provided on the multi-path IPD substrate(s) and electrically coupled to an inductive element in the form of one or more bond wires. The shunt capacitor(s) and bond wire (s) can then be tuned by design to dissipate excess energy occurring at the targeted (e.g., second order) harmonic to ground during operation of the Doherty PA package. So too may baseband decoupling or amplifier biasing circuitry be formed in the multi-path IPDs and cooperate with other circuit components (e.g., bond wires or bias leads, as the case may be) to provide the desired functionality.

As a notable benefit, the incorporation of multiple IPD regions or circuit blocks into a common substrate generally enables the spacing between the IPD regions to be reduced relative to a conventional approach in which each instance of IPD circuitry is formed on discrete semiconductor die. As a corollary, however, the propensity for electromagnetic (EM) interference, coupling, or cross-talk between the carrier and peaking signal paths increases when fabricating a Doherty PA package to contain one or more multi-path IPDs, which each include IPD regions formed in a common substrate and located in relatively close proximity. Thus, to address this secondary technical issue, embodiments of the PA package are usefully produced to further contain at least one IPD isolation structure, which provides improved signal isolation between the carrier and peaking IPD regions formed on a given multi-path IPD and, more generally, provides improved signal isolation between the carrier and peaking signal paths of the PA package. In embodiments in which the PA package contains an input multi-path IPD and an output multi-path IPD, such an isolation structure may extend from the input-multi path IPD, over the area between the amplifier dies (as seen looking downwardly on the package substrate), and to the output multi-path IPD. In such instances, the isolation structure may be referred to as an IPD-to-IPD isolation structure. Further, in embodiments, such an IPD-to-IPD isolation structure may be electrically coupled to a ground terminal of the PA package through one or both of the multi-path IPDs; e.g., in an implementation in which the PA package contains an electrically-conductive flange serving as a ground terminal, the IPD-to-IPD isolation structure may be electrically coupled to the flange through electrically-conductive vias or other metal structures formed in the IPD substrate. In various embodiments, such an electrically-grounded IPD-to-IPD isolation structure is realized utilizing one or more bond wires, which contact landing or bond pads provided on the multi-path IPDs. For example, a bond wire array or grounded wire fence may be bonded between the IPDs, perhaps while imparting the bond wires within the array with varying profiles enhancing the isolation capabilities of the bond wire array, as described more fully below.

The usage of one or more multi-path IPDs in place of multiple discrete IPDs provides several advantages. For example, in the case of a PA package containing two multi-path IPDs between which two amplifier dies are provided, the number of dies requiring precise positioning and attachment during package fabrication can be reduced by one third; that is, in this instance, four dies require installment within the PA package, including the input and output multi-path IPDs, versus six dies contained in a comparable PA package conventionally fabricated to contain single path IPDs realized on four discrete dies. This reduction in die count minimizes manufacturing variation and boosts manufacturing throughput, which, in turn, reduces overall manufacturing costs. With respect to manufacturing variation, in particular, usage of a multi-path IPDs in place multiple discrete, single path IPDs can reduce variations in not only bond wire length, but also performance parameters of the peaking and carrier IPD regions formed on the multi-path IPD; e.g., by providing a greater uniformity in build-up layer thickness, such as the thickness of a dielectric (e.g., nitride) layer utilized to form metal-insulator-metal (MIM) capacitors, to provide a highly reliable, predictable relationship between capacitance values or other such circuit element characteristics. This, in turn, eliminates or reduces the need for IPD die pairing during Doherty package fabrication to help streamline the manufacturing process. Additionally, and as previously noted, the footprint of the PA package can be reduced through the usage of such multi-path IPDs for further space savings and cost reduction. Concurrently, in embodiments in which at least one in-package isolation structure (e.g., a grounded bond wire fencing connected between input and output multi-path IPDs) is further integrated into the PA package, improved isolation between the peaking and carrier paths may be realized despite the space-constrained environment within the PA package.

Turning now to the accompanying drawing figures, description of two example PA packages (specifically, Doherty PA packages) containing multiple-path IPDs and in-package isolation structures is set-forth below in connection with FIGS. 2-7. First, however, a general description of Doherty PA package, as contained in a larger Doherty PA circuit or system, is discussed in conjunction with FIG. 1 to establish an example, albeit non-limiting context in which embodiments of the present disclosure may be better understood.

Discussion of a Generalized Example Doherty PA Package Containing Multi-Path Integrated Passive Devices and Included in a Doherty PA System FIG. 1 is a simplified schematic diagram of a Doherty PA package 10 containing two multi-path IPDs 12, 14, as illustrated in accordance with an example embodiment of the present disclosure. For purposes of description, Doherty PA package 10 is depicted as contained within a larger Doherty PA circuit or system 16, which includes an input node 18 and an output node 20. Output node 20 is electrically coupled to an electrical load 22, which is driven during operation of Doherty PA system 16. Electrical load 22 can include or assume the form of, for example, one or more antennae in embodiments in which Doherty PA system 16 is employed in a base station or other wireless communication system. A non-illustrated impedance transformer may be coupled between output node 20 and electrical load 22 in embodiments. Similarly, various other circuit components can be included in embodiments of Doherty PA system 16, which are not shown in FIG. 1 or described herein to avoid obscuring the present teachings.

A power divider 24, a carrier (or main) signal amplification path 26, a peaking (or auxiliary) signal amplification path 28, and a combining node 30 are provided between input and output nodes 18, 20 of Doherty PA system 16. When a radiofrequency (RF) input signal is applied to input node 18, a divider input node 32 contained in power divider 24 splits the RF input signal into a carrier signal and a peaking signal appearing at divider output nodes 34, 36, respectively. From power divider output nodes 34, 36, the carrier and peaking signals are then applied to a carrier input terminal 38 (e.g., a carrier input lead) and a peaking input terminal 40 (e.g., a peaking input lead) of Doherty PA package 10. From this point, the carrier and peaking signals are transmitted in parallel along carrier signal amplification path 26 and peaking signal amplification path 28, respectively, for separate amplification within Doherty PA package 10. Various additional components or circuit elements are also positioned in carrier and peaking signal amplification paths 26, 28 including, pertinently, a carrier amplifier 42 and a peaking amplifier 44. Specifically, carrier amplifier 42 and peaking amplifier 44 are positioned in carrier signal amplification path 26 and peaking signal amplification path 28, respectively, between power divider 24 and combining node 30. Amplifiers 42, 44 can be implemented in various different manners, whether as single stage or multi-stage amplifiers, and are discussed in greater detail below. Following signal amplification by carrier and peaking amplifiers 42, 44, the carrier and peaking signals are further conducted along signal amplification paths 26, 28, are outputted from Doherty PA package 10, and are ultimately combined at combining node 30 to yield a consolidated RF output signal.

Doherty PA system 16 is imparted with a standard load network configuration in the illustrated example. Accordingly, a controlled phase delay is applied to the peaking signal transmitted along peaking signal amplification path 28 by a first phase delay element 46. Phase delay element 46 can assume any form suitable for applying a desired phase delay (a quarter wave ($\lambda/4$) or 90 degree phase delay) to the peaking signal relative to the carrier signal at the center frequency of operation (fo). In various implementation, phase delay element 46 assumes the form of a quarter wave ($\lambda/4$) transmission line. A second phase delay element 48 is likewise provided on the output side of the carrier signal amplification path 28 to compensate for the resulting 90 degree phase delay difference between carrier and peaking amplification paths 26, 28 at the inputs of amplifiers 42, 44. Output phase delay element 48 introduces an appropriate signal delay to the carrier signal, thereby ensuring the amplified signals arrive in phase for recombination into the amplified RF output signal at combining node 30. Again, output phase delay element 48 may assume the form of a quarter wave ($\lambda/4$) transmission line in embodiments dimensioned to provide an appropriate electrical length between the output of carrier amplifier 42 and combining node 30 to achieve the desired (e.g., 90 degree) phase delay. In other embodiments, Doherty PA system 16 may alternatively have an inverted load network configuration such that a controlled phase delay is applied to carrier input signal prior to amplification at carrier amplifier 42 and a corresponding phase delay is applied to the peaking output signal prior to signal recombination at combining node 30.

As indicated by a first cross-hatch pattern (identified by a key 50 appearing in the lower right of FIG. 1), input multi-path IPD 12 includes two IPD regions 52, 54. As appearing herein, the term "IPD region" refers to a first region or block of passive circuitry formed in and/or on a substrate along with at least a second region or block of passive circuitry (another IPD region), with the regions or blocks of passive circuitry (the IPD regions) being electrically-isolated from one another. IPD regions 52, 54 may be more fully referred to as "electrically-isolated IPD regions 52, 54" to indicate that the circuitry defining IPD regions 52, 54 is electrically isolated; e.g., by an intervening isolation region, which may contain circuitry aiding in EM shielding of IPD regions 52, 54 as described more fully below. As further indicated by a second cross-hatch pattern identified in key 50, electrically-isolated IPD regions 52, 54 are formed in a common substrate 56 (e.g., a die body, a PCB, a ceramic substrate, or similar structure) further included in multi-path IPD 12. In a similar regard, and as indicated by a third cross-hatch pattern identified in key 50, multi-path IPD 14 includes two electrically-isolated IPD regions 58, 60 formed in a common substrate 62 (identified by a fourth cross-hatch pattern). In various embodiments, and as generally indicated in FIG. 1, IPD substrates 56, 62 may be produced as separate structures, such as discrete ceramic substrates or semiconductor dies of the type discussed more fully below in connection with FIGS. 2-6. In other instances, IPD substrates 56, 62 may be joined as a single substrate, such as a PCB embedded within Doherty PA package 10, as discussed below in conjunction with FIG. 7.

Describing now input multi-path IPD 12 in greater detail, circuitry forming (or helping form) a carrier input impedance MN 64 is provided in IPD region 52, while circuitry forming (or helping form) a peaking input impedance MN 66 is provided in IPD region 54. Carrier input impedance MN 64 is electrically coupled between carrier input terminal or lead 38 of Doherty PA package 10 and a terminal of carrier amplifier 42. Comparatively, peaking input impedance MN 66 is electrically coupled between peaking input terminal or lead 40 of Doherty PA package 10 and a terminal of peaking amplifier 44. During operation of Doherty PA system 16, input impedance MNs 64, 66 serve to incrementally increase the circuit impedance of Doherty PA package 10 toward the source impedance. The particular manner in which input impedance MNs 64, 66 are implemented will vary between embodiments, providing that MNs can provide the desired impedance matching prior to transmission of the carrier and peaking signals to amplifiers 42, 44. In one implementation, and by way of non-limiting example only, input impedance MNs 64, 66 are each imparted with a T-match configuration, an example of which is shown in detail bubble 68 appearing in the upper left of FIG. 1. While detail bubble 68 is visually tied to or associated with carrier input impedance MN 64 in this drawing figure, the T-match circuit topology shown in detail bubble 68 may be equally applicable to peaking input impedance MN 66 in embodiments. As shown, input impedance MNs 64, 66 may each include a number of inductive elements 70, 72, 74, and at least one shunt capacitive element 76. Inductive elements 70, 72, 74 may be realized as bond wires or integrated spiral inductors, while shunt capacitive element 76 may be a grounded (e.g., MIM) capacitor structure formed in or supported by substrate 56 in embodiments. Further description of an example manner in which such a T-match circuit configuration may be implemented in provided below in connection with FIGS. 2 and 3. Other embodiments may include input impedance MNs 64, 66 having other circuit topologies and/or forming other filter types.

In addition to MNs 64, 66, IPD regions 52, 54 of multi-path IPD 12 may further include circuitry 78, 80 for performing or supporting other circuit functions. Such other functions can include baseband decoupling, harmonic termination, transistor (e.g., FET gate) biasing, and other signal filtering functions. Addressing harmonic termination in greater detail, an example harmonic termination structure or circuit 82, 84 is shown in detail bubble 86 appearing in the lower left of FIG. 1. While visually associated with circuitry 80 contained in carrier input IPD region 54, example circuit 82, 84 can also be implemented for circuitry 78 contained in peaking input IPD region 52. In this example, input harmonic termination circuit 82, 84 includes a resonant inductor/capacitor (LC) circuit, with an inductive element 82 electrically coupled to ground (or another reference voltage) through a capacitive element 84 (thus providing a shunt capacitance). By varying the inductance and capacitance values of inductive element 82 and capacitive element 84, input harmonic termination circuit 82, 84 can be tuned to resonate at a targeted harmonic frequency (e.g., 2fo) in order to terminate the signal energy at the targeted harmonic frequency prior to transmission of the signal to carrier amplifier 42 or to peaking amplifier 44, as the case may be. Amplifier performance is enhanced as a result. In further implementations, such harmonic termination circuitry 78, 80 within IPD regions 52, 54 may have a different construction for removing or minimizing signal energy at a targeted harmonic frequency, typically the second order harmonic frequency (2fo) of the carrier and peaking signals. Additionally or alternatively, such additional IPD circuitry 78, 80 may be configured for another purpose (e.g., baseband decoupling, gate biasing, drain biasing, etc.) or may be omitted from multi-path IPD 12 altogether.

The foregoing description of input multi-path IPD 12 is generally equally applicable to output multi-path IPD 14, with the slight caveat that input multi-path IPD 12 and output multi-path IPD 14 will be tuned differently and may or may not perform different functions. Accordingly, as further indicated in FIG. 1, electrically-isolated output IPD regions 58, 60 may include circuitry forming a carrier output impedance MN 88 and a peaking output impedance MN 90, respectively, possibly as taken in combination with other non-illustrated circuit elements (e.g., bond wires) further included in Doherty PA package 10, as described below. Output impedance MNs 88, 90 may each have a T-match topology similar or identical to that described above in connection with detail bubble 68 and carrier input impedance MN 64. In other embodiments, output impedance MNs 88, 90 may have other topologies suitable for increasing the circuit impedance of Doherty PA package 10 toward the load impedance of electrical load 22, noting that additional impedance transformation may also be provided outside of Doherty PA package 10 in embodiments. Additionally, as was previously the case, output IPD regions 58, 60 may include other circuitry 92, 94 providing harmonic termination, baseband decoupling, transistor (e.g., FET drain) biasing, and other such functionalities. In embodiments, circuitry 92 of output carrier IPD region 58 and circuitry 94 of output peaking IPD region 60 provides second order (2fo) harmonic termination of the carrier and peaking signals, respectively; and may each have topology similar or identical to that described above in connection with detail bubble 86 and circuitry 80 of input peaking IPD region 54.

Doherty PA package 10 further contains an IPD-to-IPD isolation structure 96 in the example of FIG. 1, with isolation structure 96 extending from multi-path IPD 12 to multi-path IPD 14. In this regard, IPD-to-IPD isolation structure 96 may extend generally along a first axis along which multi-path IPDs 12, 14 are spaced (corresponding to the X-axis of coordinate legend 98). Additionally, IPD-to-IPD isolation structure 96 may also extend through or over the region or space 100 separating amplifiers 42, 44, as taken along a second axis perpendicular to the first axis (corresponding to Y-axis of coordinate legend 98). One or both ends of the IPD-to-IPD isolation structure 96 may be electrically coupled to a ground terminal of Doherty PA package 10 in embodiments. For example, and as described more fully below in connection with FIGS. 2-6, IPD-to-IPD isolation structure 96 may be electrically coupled to a non-illustrated base flange through electrical features (e.g., landing pads and conducive vias or metal plugs) formed in IPD substrates 56, 62. Although generically illustrated as a block in FIG. 1, IPD-to-IPD isolation structure 96 can be fabricated as a wire fence in embodiments, with an example of such a wire fence discussed below. In other instances, IPD-to-IPD isolation structure 96 may be replaced by another type of isolation structure or isolation structures; e.g., in a further embodiment, multi-path IPDs 12, 14 may be fabricated to included grounded electrically-conductive and/or magnetically-permeable structures (e.g., a wall, fin, or wire bonds) that extend upwardly from the isolation regions of multi-path IPDs 12, 14, but which do not extend fully between IPDs 12, 14 as shown.

With continued reference to FIG. 1, and as schematically indicated by symbols 102, 104, carrier amplifier 42 and peaking amplifier 44 each include at least one power transistor integrated circuit (IC) for amplifying RF signals conducted through amplifiers 42, 44. Each power transistor IC 102, 104 may be fabricated on a discrete semiconductor die 106, 108 and imparted with either a single-stage or multi-stage amplifier configuration. In embodiments, all amplifier stages (or a final amplifier stage) of either or both carrier amplifier 42 and peaking amplifier 44 may be implemented utilizing any of the following transistor technologies: a silicon-based FET (e.g., a laterally-diffused metal oxide semiconductor FET or LDMOS FET) or a III-V FET (e.g., a gallium nitride (GaN) FET, a gallium arsenide (GaAs) FET, a gallium phosphide (GaP) FET, an indium phosphide (InP) FET, or an indium antimonide (InSb) FET, or another type of III-V transistor). The carrier and peaking transistor ICs may be equally sized when, for example, Doherty PA package 10 has a symmetric Doherty configuration. Alternatively, the carrier and peaking transistor ICs may have unequal sizes in the case of various asymmetric Doherty configurations; it being understood that the term "size," as appearing in this context, is utilized in reference to the active periphery or total active gate width of the power transistor ICs. In an asymmetric Doherty configuration, specifically, the peaking transistor IC(s) may be larger than the carrier transistor IC(s) by some multiplier. For example, the peaking transistor IC(s) may be twice the size of the carrier transistor IC(s) such that the peaking transistor IC(s) have approximately twice the current carrying capability of the carrier transistor IC(s). Peaking-to-carrier amplifier IC size ratios other than a 2:1 ratio may be utilized, as well. Further, either or both of power amplifiers 42, 44 may be implemented with multiple parallel amplification paths (rather than with a single amplification path) in more complex embodiments. For example, in an example asymmetric Doherty configuration, carrier amplifier 42 may be implemented with two (or a greater number of) parallel amplification paths, while peaking amplifier 44 is implemented with three (or some other number of) parallel amplification paths. Further, in the case of an N-way Doherty amplifier (N>2), Doherty PA package 10 may contain multiple peaking amplifiers of differing configurations or levels.

For convenience of explanation, and to reflect the fact that FETs are predominately utilized in the production of Doherty PA devices at present, the foregoing paragraph and this document, as a whole, principally focus on implementations of the (e.g., Doherty) PA devices implemented utilizing FETs. It is emphasized, however, that alternative embodiments of the present disclosure can be implemented utilizing other transistor technologies including, but not limited to, bipolar transistors. Accordingly, in embodiments of Doherty PA package 10 shown in FIG. 1, and in embodiments of all other PA devices described herein, any and all amplifier stages can be implemented utilizing any suitable transistor technology, such as FETs, bipolar transistors, or a combination thereof. An example of a single stage FET is shown in detail bubble 110 in FIG. 1. Here, the input carrier signal fed to carrier transistor IC 102 may be applied to a gate manifold or control terminal 112 of the illustrated FET, which further includes a drain terminal 116 (generally, an output terminal or pad) and a source terminal 114 electrically coupled to ground or another reference voltage (e.g., via a non-illustrated base flange). Drain terminal 116 serves as the output of carrier amplifier 42 in this example, with the amplifier carrier signal appearing at terminal 116 then transmitted to carrier IPD region 58 of multi-path IPD 14. Peaking transistor IC 104 may likewise be implemented a single stage FET in embodiments, with the control terminal of the FET receiving the output signal from peaking IPD region 54 of multi-path IPD 12, the drain terminal of the FET providing an amplified output signal to peaking IPD region 60 of multi-path IPD 14, and the source terminal of the FET electrically coupled to a reference voltage (e.g., ground) through a non-illustrated flange further included in Doherty PA package 10.

Carrier amplifier 42 of Doherty PA package 10 may be biased to function in class AB mode during circuit operation, while peaking amplifier 44 is biased to function in class C mode. At low power levels (e.g., when the power of the input signal is less than the turn-on threshold level of peaking amplifier 44), Doherty PA package 10 operates in a low-power or back-off mode. In the low-power (back-off) mode, carrier amplifier 42 is typically the only amplifier supplying current to load 22. Conversely, when the power of the input signal exceeds a threshold level of peaking amplifier 102, Doherty PA package 10 transitions to operation in a high-power mode in which carrier amplifier 42 and peaking amplifier 44 supply current to load 22 concurrently. At this point, peaking amplifier 44 provides active load modulation at combining node 30, thereby allowing a continued, linear increase in the current of carrier amplifier 42. After transmission through the circuitry formed in multi-path IPD regions 58, 60, the amplified output signals of power amplifiers 42, 44 appear at output nodes or terminals 118, 120 of Doherty PA package 10. Accordingly, output terminal 118 may be a peaking output lead of Doherty PA package 10, while output terminal 120 is a carrier output lead. The amplified output signals are then combined at combining node 30 and applied to electrical load 22, with the appropriate phase delay applied to the amplified carrier output signal as previously described. Through the inclusion of Doherty PA package 10, the overall size and cost of Doherty PA circuit or system 16 may be reduced, while the (e.g., isolation and efficiency) of system 16 is boosted. With a general description of Doherty circuit function now provided, potential manners in which embodiments of Doherty PA package 10 may be physically implemented are set-forth below in connection with FIGS. 2-7.

Figure 2:
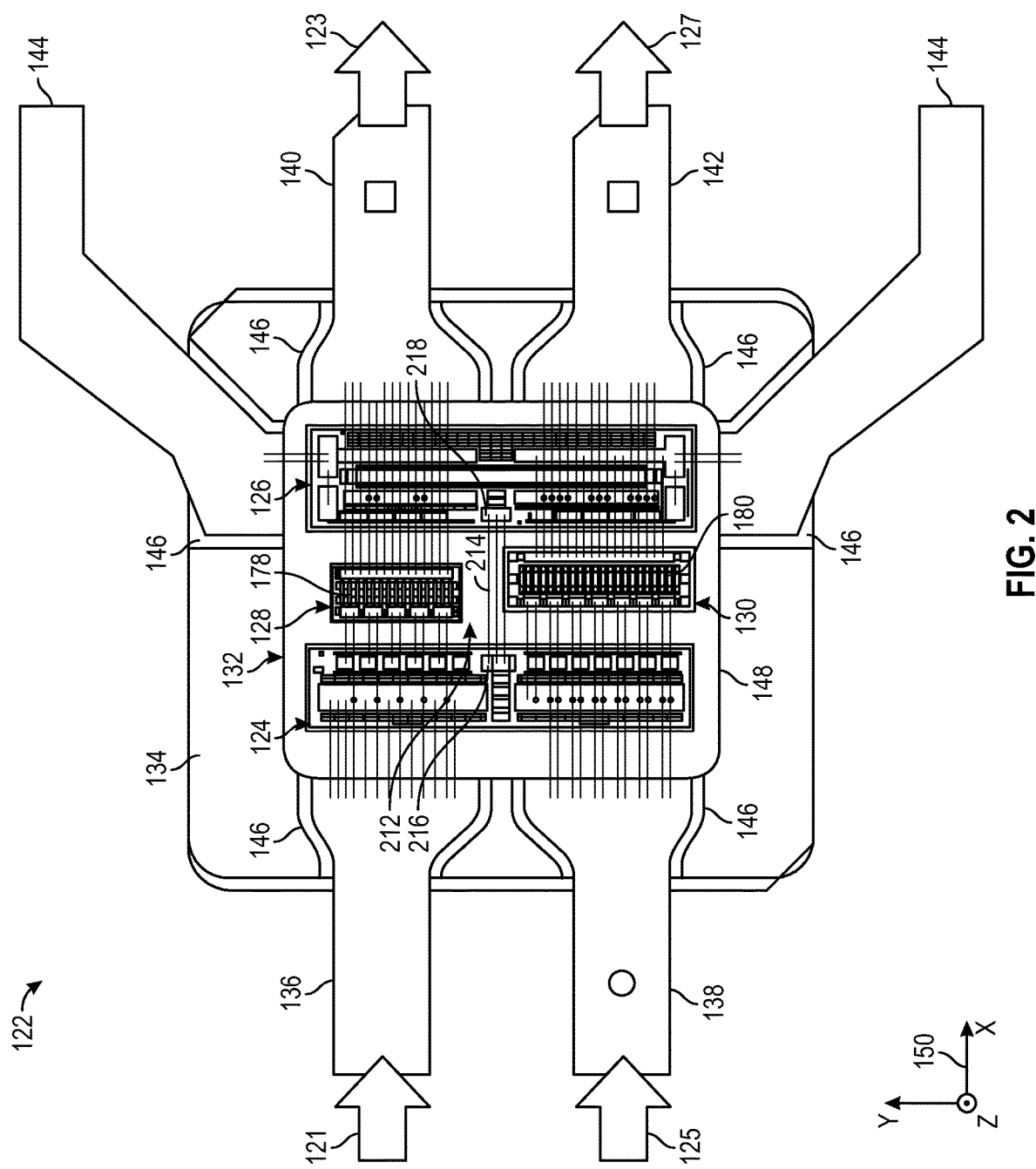
FIG. 2 is a top-down or planform view of a Doherty PA package, which contains an input multi-path IPD (realized utilizing a first IPD die), an output multi-path IPD (realized utilizing a second IPD die), and an IPD-to-IPD isolation structure (here, a grounded wire fence), illustrating an example manner in which the Doherty PA package schematically shown in FIG. 1 may be implemented.
Figure 3:
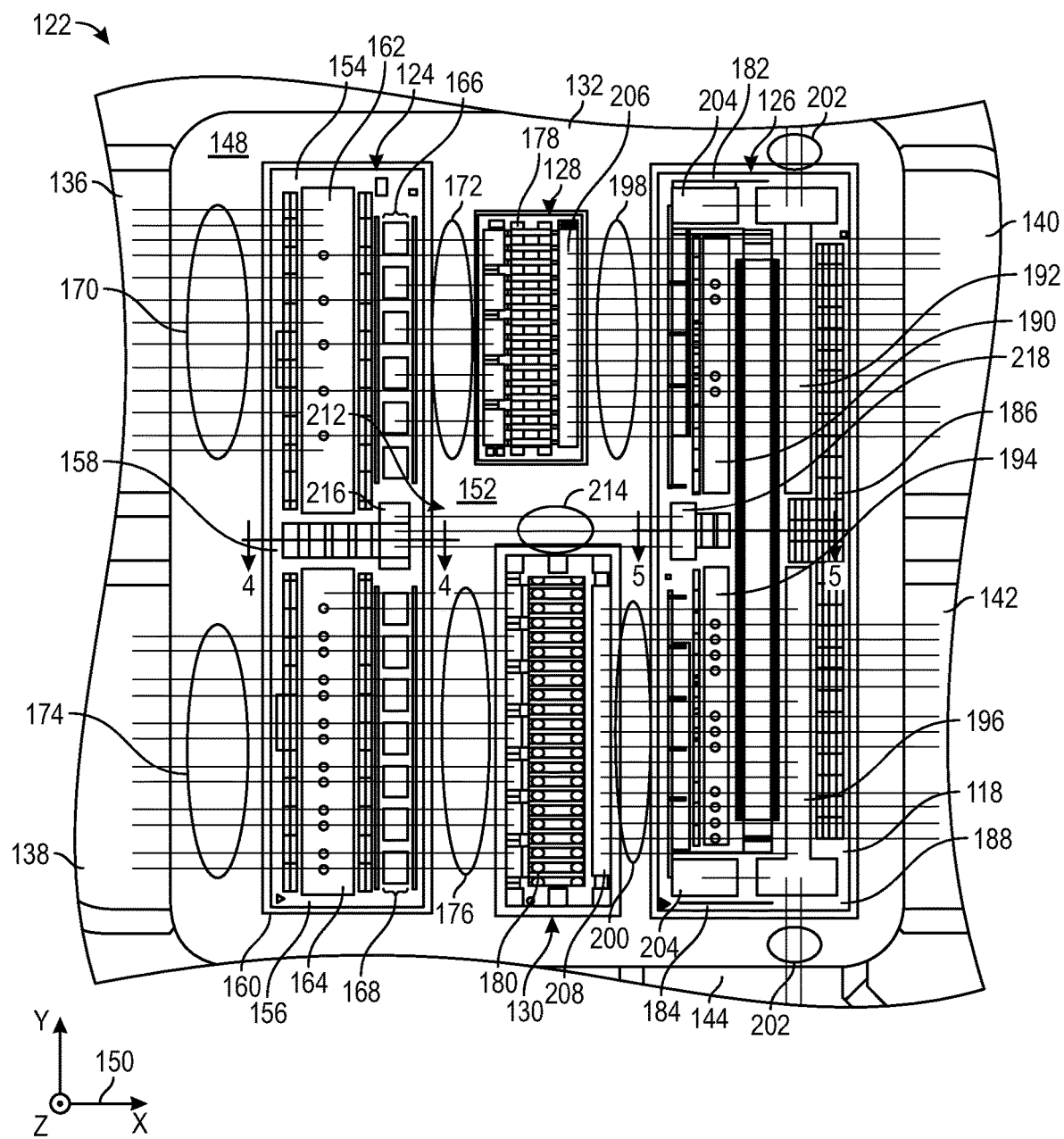
FIG. 3 is a detailed view of a central portion of the Doherty PA package shown in FIG. 2 depicting the multi-path IPD dies, the IPD-to-IPD bond wire fence, the power amplifier dies, and various bond wire interconnections in greater detail.
Figure 4:
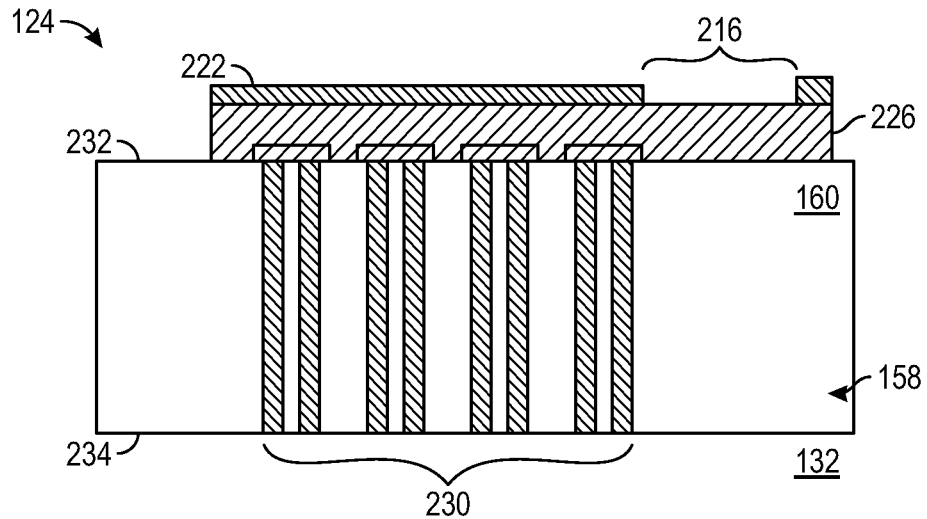
FIGS. 4 and 5 are simplified cross-sectional views of the multi-path IPD dies contained in the example Doherty PA package of FIGS. 2 and 3, as taken along section planes 4-4 and 5-5 identified in FIG. 3, respectively.

Example of a Doherty PA Package Containing Multi-Path Integrated Passive Devices Referring now to FIGS. 2 and 3, a Doherty PA package 122 containing two multi-path IPDs 124, 126 is shown in accordance with a further example embodiment of the present disclosure. In this particular example, multi-path IPDs 124, 126 are implemented utilizing discrete semiconductor dies and are consequently referred to hereafter as "multi-path IPD die 124" and "multi-path IPD die 126," respectively. Other types of discrete substrates, such as ceramic substrates, can be utilized to produce multi-path IPDs 124, 126 in further implementations. In addition to multi-path IPD dies 124, 126, Doherty PA package 122 also contains a carrier amplifier die 128 and a peaking amplifier die 130. Therefore, in total, Doherty PA package 122 contains four IC dies 124, 126, 128, 130, which are attached to the upper surface or frontside of a package substrate 132. Package substrate 132 forms a part or portion of a larger package body 134 of Doherty PA package 122 within which dies 124, 126, 128, 130 are contained.

A number of leads 136, 138, 140, 142, 144 extend from package body 134. In this example, the package leads include: a carrier input lead 136, a peaking input lead 138, a carrier output lead 140, a peaking output lead 142, and two bias leads 144. Metallization layers 146 are utilized to attach the inner terminal end portions of package leads 136, 138, 140, 142, 144 to upper surfaces of the peripheral package sidewall extending around an upper perimeter of package substrate 132. The peripheral package sidewall is composed of a dielectric (e.g., molded) material to provide electrical isolation between package leads 136, 138, 140, 142, 144 and underlying package substrate 132, which may serve as an electrically-conductive (e.g., ground) terminal in embodiments of Doherty PA package 122. Arrows 121, 123 represent the carrier input signal applied to carrier input lead 136 and the amplified carrier output signal appearing at carrier output lead 140, respectively; while arrows 125, 127 represent the peaking input signal applied to peaking input lead 138 and the amplified peaking output signal appearing at peaking output lead 142, respectively. Arrows 121, 123 may also be jointly considered as denoting the carrier signal amplification path extending through Doherty PA package 122, while arrows 125, 127 may be considered representative of the peaking signal amplification path extending through package 122.

The particular manner in which package body 134 of Doherty PA package 122 is constructed will vary between embodiments. For example, in embodiments in which Doherty PA package 122 is fabricated as an air cavity package, Doherty PA package 122 may further include a non-illustrated lid or cover piece, which is bonded over an upper, peripheral package sidewall to enclose a gas-containing cavity (containing air or another inert gas) in which IC dies 124, 126, 128, 130 are housed. The peripheral package sidewall may be formed around above package substrate 132 to bound an outer periphery of the air cavity utilizing, for example, a molding process or by assembling the package sidewall from one or more dielectric pieces (commonly referred to as a "window frame"). In embodiments in which a molded package body is formed, the molded package body may extend downwardly to over the sidewalls of package substrate 132 to cover the sidewalls of package substrate 132 (e.g., a base flange), providing a lower surface of substrate 132 remains exposed for electrical connection in instances in which substrate 132 serves as an electrically-conductive terminal of Doherty PA package 122. In other embodiments, Doherty PA package 122 may assume other forms, such as an over-molded or encapsulated package lacking a gas-containing cavity. Generally, then, embodiments of the present disclosure are open to implementation with various different package constructions.

In the example of FIGS. 2 and 3, and as briefly indicated above, package substrate 132 assumes the form of an electrically-conductive base flange and will consequently be referred to as "base flange 132" or "flange 132" hereafter. Base flange 132 of Doherty PA package 122 can be realized as a body of material, a layered or laminated structure, or other substrate suitable for supporting IC dies 124, 126, 128, 130. Additionally, base flange 132 may serve as a heatsink and/or an electrically-conductive terminal of Doherty PA package 122. By way of example, base flange 132 may assume the form of a monolithic metallic structure, plate, or slug in certain implementations. In other implementations, the base flange 132 may have a multilayer metallic construction; e.g., base flange 132 may contain multiple thermally-conductive layers, which are bonded in a stacked or laminated arrangement. Often, the base flange 132 will be composed predominately of one or more metals having relatively high thermal conductivies, such as copper (Cu). As a more specific example, in an embodiment wherein base flange 132 is a layered or laminated structure, base flange 132 may include at least one Cu layer combined with at least one disparate metal layer having a Coefficient of Thermal Expansion (CTE) less than that of the Cu layer. The disparate metal layer may be composed of, for example, Molybdenum (Mo), a Mo—Cu alloy, or a Mo—Cu composite material. In this manner, base flange 132 may be imparted with both a relatively high thermal conductivity and a lower effective CTE.

Base flange 132 has an upper principal surface or frontside 148 to which IC dies 124, 126, 128, 130 are attached or bonded. IC dies 124, 126, 128, 130 may be bonded to frontside 148 of base flange 132 utilizing an electrically-conductive material in embodiments, such as a metal-filled epoxy, a sintered metal material, or another electrically-conductive die attach material. In a manner similar to Doherty PA package 10 shown in FIG. 1, power amplifier dies 124, 126 are spaced along a first axis of package 10 extending parallel to frontside 148 of base flange 132 and corresponding to the Y-axis of a coordinate legend 150 shown in the lower left of FIGS. 2 and 3. This axis may also be referred to as a longitudinal axis of Doherty PA package 122 in embodiments, given that IC dies 124, 126, 128, 130 and possibly package 122 itself may be (although are not necessarily) elongated along this axis. The region separating power amplifier dies 124, 126, herein the "amplifier die offset" or "amplifier die gap," is further identified in FIG. 3 by reference numeral 152 in FIG. 3. Comparatively, multi-path IPD dies 124, 126 are spaced along a second axis perpendicular to the first axis and extending parallel to frontside 148 of base flange 132 (corresponding to the X-axis of a coordinate legend 150). The spacing between multi-path IPD dies 124, 126 (also referred to herein as constituting "an inter-IPD gap") is sufficient to accommodate power amplifier dies 128, 130, which are positioned between dies 124, 126 as taken along the X-axis of coordinate legend 150. In the illustrated example, multi-path IPD dies 124, 126 are imparted with lengths such that dies 124, 126 extend past the outer edges of amplifier dies 128, 130, as taken along the Y-axis. In other embodiments, the planform shapes, dimensioning, and relative positioning of IC dies 124, 126, 128, 130 can vary.

As identified in FIG. 3, input multi-path IPD die 124 includes two electrically-isolated IPD regions: (i) an input carrier IPD region 154, and (ii) an output carrier IPD region 156. Additionally, an intermediate isolation region 158 is provided between IPD regions 154, 156, as taken along the Y-axis of coordinate legend 150 (again, also referred to as the "longitudinal axis" of Doherty PA package 122 herein). Regardless of whether isolation region 150 contains circuit elements (e.g., electrically-conductive vias or metal plugs providing signal conduction through the body of die 124), isolation region 150 may also be referred to as an "IPD region" herein in view of the inclusion of the region 150 within multi-path IPD die 124. At least IPD regions 154, 156 are defined by electrically-conductive circuit features formed in a common substrate IPD substrate 160, which, in this example, assumes the form of a semiconductor die. IPD substrate 160 spans the space between the signal amplification paths extending through multi-path IPD die 124. IPD regions 154, 156 include elongated input-side landing or bond pads 162, 164 and a plurality of smaller output-side landing or bond pads 166, 168 (only a few of which are labeled to avoid cluttering the drawing). Bond pads 162, 164, 166, 168 are included in or electrically coupled to grounded capacitors (e.g., bond pads 162, 164, 166, 168 may form or be connected to the upper metal plates of metal-insulator-metal (MIM) capacitors formed in IPD substrate 160), which are electrically coupled to base flange 132 through IPD substrate or die body 160 of multi-path IPD die 124. Consequently, elements 162, 164, 166, 168 may also be referred to as forming part of or connecting to "shunt capacitors" or "capacitive elements" herein. Die body 160 of input multi-path IPD die 124 can be composed, in part or in whole, of various semiconductor materials as listed above in connection with power amplifier dies 124, 126; e.g., in embodiments, die body 160 may be composed of a piece of a bulk silicon (Si) wafer or a multi-layer semiconductor substrate containing a buried oxide layer. So too may the below-described die body 188 be composed of Si or another semiconductor material, in whole or in part (as in the case of a layered semiconductor structure).

A number of bond wires 170, 172, 174, 176 electrically interconnect bond pads 162, 164, 166, 168 (and, more generally, multi-path IPD 124) between package input leads 136, 138 and the input terminals of power amplifier dies 128, 130. Specifically, a first bond wire array 170 electrically connects an interior edge of carrier input lead 136 to elongated bond pad 162 located within input carrier IPD region 154. A second bond wire array 172 includes longer bond wires (also referred to as a "double humped" bond wires in view of the common contact point on elongated bond pad 162), which electrically connect bond pad 162 to an input terminal (here, gate contacts) of a single-stage amplifier or FET 178 formed on carrier amplifier die 128; and further includes shorter bond wires, which electrically connect bond pads 164 to the input terminal of FET 178. Similarly, a third bond wire array 174 electrically connects an interior edge of peaking input lead 138 to bond pad 164, while longer bond wires within a fourth bond wire array 176 electrically connect bond pad 164 to an input terminal (here, gate contacts) of a single-stage amplifier or FET 180 formed on peaking amplifier die 130 and shorter bond wires within array 176 electrically connect bond pads 168 to the input terminal of FET 180.

In the example of FIG. 3, a carrier input impedance MN 162, 170, 172 having a T-match configuration is formed by the combination of bond wires 170 (providing a first lump inductance), the shunt capacitance coupled to bond pad 162, and bond wires 172. This circuit structure generally corresponds to the T-match configuration shown in detail bubble 68 of FIG. 1, with bond wires 170 corresponding to inductive element 70, the shunt capacitance partially coupled to bond pad 162 corresponding to shunt capacitive element 76, and bond wires 172 corresponding to inductive element 72. By configuring bond wires 170, 172 (e.g., by selecting appropriate dimensions) to provide inductances at the center operating frequency of Doherty PA package 122 and the shunt capacitance coupled to bond pad 162 to provide the desired capacitance (through appropriate dimensioning of the conductive and dielectric layers of the MIM capacitor), carrier input impedance MN 162, 170, 172 can raise the source impedance of the carrier input signal to a desired level prior to application to the input terminal(s) of FET 178. In a like manner, a peaking input impedance MN 164, 174, 176 is provided by the combination of bond wires 174, 176 and the shunt capacitance coupled to bond pad 162; with the peaking input impedance MN 164, 174, 176 also tuned by desired to provide the desired impedance matching function of the peaking input signal prior to application to the input terminal(s) of FET 180.

In many respects, output multi-path IPD die 126 is similar to input multi-path IPD die 124. Output multi-path IPD die 126 includes an output carrier IPD region 182, an output peaking IPD region 184, and an intermediate isolation region 186 formed between IPD regions 182, 184. Regions 182, 184, 186 are formed at different locations in a common substrate 188; here, the body of a semiconductor die, which spans the space between the signal amplification paths extending through multi-path IPD die 124. IPD regions 184 include, in turn, landing pad areas or bond pads 190, 192, 194, 196. Various bond wires 198, 200 interconnect bond pads 190, 192, 194, 196 with FETs 178, 180 carried by power amplifier dies 128, 130 and output leads 140, 142. Additionally, in this example, additional bond wires 202 electrically couple bond pads 192, 196 to two additional leads 144 of Doherty PA package 122. When Doherty PA package 122 is installed in a larger Doherty PA circuit or system, package leads 144 provide electrical connections to circuitry within the larger system (e.g., package-external circuit elements formed on or mounted to a PCB, such as chip caps), with such circuitry aiding in FET biasing and/or baseband decoupling. Certain ones of bond wires 198, 200 thus cooperate with bond pads 190, 192, as well as grounded bond pads 204, to form the desired output impedance MNs, bias circuitry, and/or harmonic termination circuits. Consider for example the mid-length bond wires included in bond wire array 198, which are bonded between an output terminal (here, a drain manifold 206 of FET 178) and elongated bond pad 190 within output carrier IPD region 182. Here, the first portions of the mid-length bond wires of array 198 (in other words, the first bond wire segment in the double-humped bond wire landing on bond pad 190) collectively provide a first inductive value, while the MIM capacitor coupled to bond pad 190 provides a shunt capacitance having a selected capacitance value. The mid-length bond wires of array 198 further provide a second inductive value in extending to bond pad 192 (that is, the second bond wire segment in the double-humped bond wire) to complete a T-match MN configuration. Harmonic termination may be further provided by the shorter bond wires within array 198 (sized to provide the desired inductance), which terminate at bond pad 190. Bond pad 190 is, in turn, electrically coupled to a shunt capacitance providing the desired capacitance to complete an LC circuit. Finally, the longer bond wires in array 198 extend fully from output terminal 206 of carrier FET 178 to the inner edge portion of carrier output lead 140 to transmit the amplified carrier signal from FET 178 to carrier output lead 140. An analogous topology is also provided for bond wires 200 and peaking output IPD region 184, with bond wires 200 electrically interconnecting the output terminal (here, a drain manifold) of peaking FET 180 to landing pads areas 194, 196 and peaking output lead 142 in a like manner.

By virtue of the construction of Doherty PA package 122, several benefits are achieved. Package footprint is minimized due to the usage of multi-path IPD dies 124, 126 in place of a conventional four IPD die arrangement Additionally, package assembly is streamlined by reducing the number of dies requiring positioning within the Doherty PA package from six dies to four dies. This not only reduces the duration of package assembly, but further eases precise angular positioning of multi-path IPDs dies 124, 126 due, at least in part, to the larger size (principally, larger longitudinal dimensions) of dies 124, 126. Manufacturing variation is also favorably reduced by the usage of multi-path IPD dies 124, 126 in place of a conventional four IPD die arrangement. By fabricating a given multi-path IPD die to include two IPD regions formed on a common substrate, uniformity in layer thickness is better preserved across the substrate to enhance consistency in device performance. For example, integrated (e.g., MIM) capacitors formed in different IPD regions can more predictably provide expected or predicted capacitance values to the thickness uniformity of conductive (e.g., Cu or other metal) layers and dielectric (e.g., nitride) layers intervening between the plates of the MIM capacitors. Comparatively, in conventional fabrication approaches in which a peaking IPD (either input or output) and a carrier IPD (either input or output) are formed on discrete dies, a greater variation in layer thickness and therefore performance parameters (e.g., capacitance values) can occur, requiring more thorough testing and die pairing processes as a result.

The above-described advantages ultimately improve manufacturing throughout and lower manufacturing costs of Doherty PA package 122. Concurrently, and as noted above, Doherty PA package 122 is beneficially (although non-essentially) imparted with a reduced footprint due, at least in part, to a decrease in the longitudinal spacing between the input IPD regions and a corresponding decrease in longitudinal between the output IPD regions of multi-path IPD dies 124, 126. As a corollary, the propensity for electromagnetic (EM) interference or cross-talk between the carrier signal path and the peaking signal path likewise increases absent the provisional of additional in-package isolation or shielding. For this reason, in embodiments, Doherty PA package 122 is produced to further include an isolation structure 212 extending from multi-path IPD die 124 to multi-path IPD die 126, and over amplifier die gap 152, to provide enhanced isolation or EM shielding between input IPD regions 154, 156 and output IPD regions 182, 184. Additionally, IPD-to-IPD isolation structure may further provide isolation between carrier amplifier die 128 and peaking amplifier die 130, as well as the various bond wires interconnecting power amplifier dies 128, 130 and multi-path IPD dies 124, 126, as described below.

In certain instances, IPD-to-IPD isolation structure 212 may assume the form of a wall, fin, or partition extending between intermediate isolation regions 158, 186 of multi-path IPD dies 124, 126. Such an isolation wall (or a similar structure) may be a single layer or multi-layer structure, which is composed of one or more electrically-conductive and, in some embodiments, magnetically-permeable materials. Further, such an isolation wall may be electrically grounded (or otherwise coupled to a reference voltage) through one or both of the multi-path IPD dies 124, 126 (e.g., by electrically connection to conductive vias extending through IPD dies 124, 126 to electrically-conductive base flange 132 below) or through additional leads extending from the body of Doherty PA package 122. In such embodiments, the isolation wall may be bonded in place during package assembly and, perhaps, embedded in a lid positioned over the package body in implementations in which Doherty PA package 122 assumes the form of an air cavity package. In other instances, IPD-to-IPD isolation structure 212 may assume a different form suitable for providing the desired isolation between the carrier and peaking signal amplification paths, particularly those segments of the signal amplification paths extending through adjacent IPD regions of multi-path IPD dies 124, 126 in which impedance matching (and other such) circuitry is formed. For example, as indicated in FIGS. 2 and 3, IPD-to-IPD isolation structure 212 may include a bond wire array 214, which is bonded between a first landing pad 216 located in intermediate isolation region 158 of input multi-path IPD die 124 and a second landing pad 218 located in intermediate isolation region 186 of output multi-path IPD die 126.

Bond wire array 214 may be electrically coupled to a ground terminal of Doherty PA package 122 (here, base flange 132) via electrical routing features (e.g., conductive vias or metal plugs) formed through one or both of multi-path IPD dies 124, 126. This may be further appreciated by referring to FIGS. 4 and 5, which are cross-sectional views of multi-path IPD dies 124, 126 taken along section planes 4-4 and 5-5 identified in FIG. 3, respectively. Addressing initially FIG. 4, intermediation isolation region 158 of multi-path IPD die 124 is shown in cross-section taken along a section plane through IPD substrate 160 (here, the die body) of semiconductor die 124. As can be seen, landing pad 216 is defined by an opening in an outer dielectric (e.g., solder mask) layer 222, which exposed a region of a lower conductive (e.g., Cu or other metal) layer 226. A cluster or farm of through substrate vias (TSVs) 230 is further formed through die substrate 160, extending from a frontside 232 to a backside 234 thereof. Backside 232 of multi-path IPD substrate or die body 160 is, in turn, placed in electrical contact with base flange 132 (noting, of course, that an electrically-conductive bonding material will typically present at the interface between backside 232 of die body 160 and base flange 132). In this manner, bond wire array 214 is electrically coupled to the ground terminal of Doherty PA package 122 (here, base flange 132) and will thus be electrically coupled to ground (or another reference voltage) when Doherty PA package 122 is installed within a larger Doherty PA circuit or system, such as Doherty PA system 16 described above in-connection with FIG. 1. Such a grounded bond wire array 214 utilized for isolation purposes may be alternatively referred to as a "wire fence 214," with this terminology also utilized below.

Figure 5:
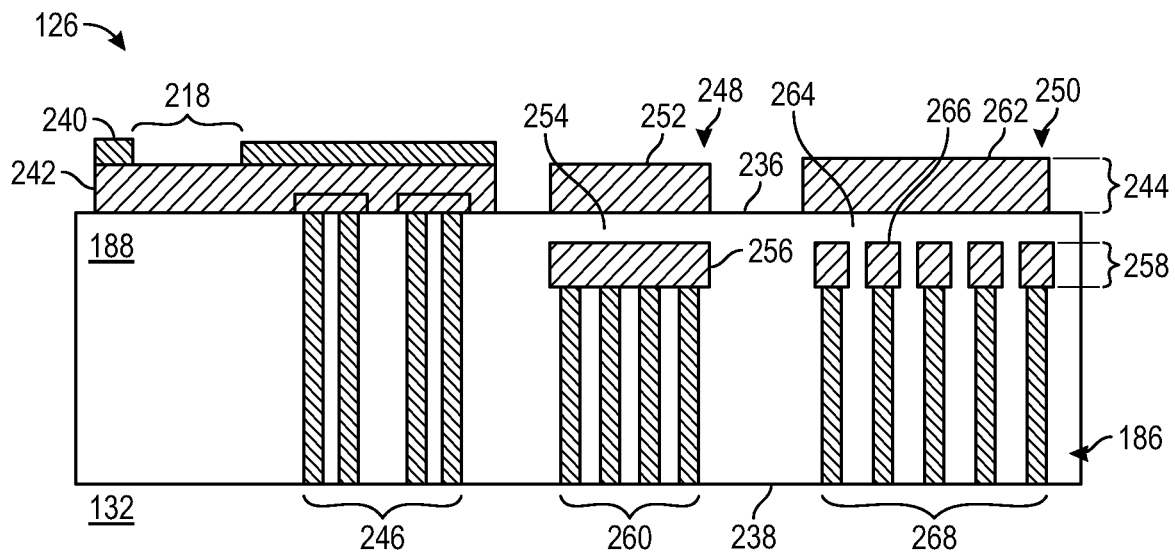
Figure 6:
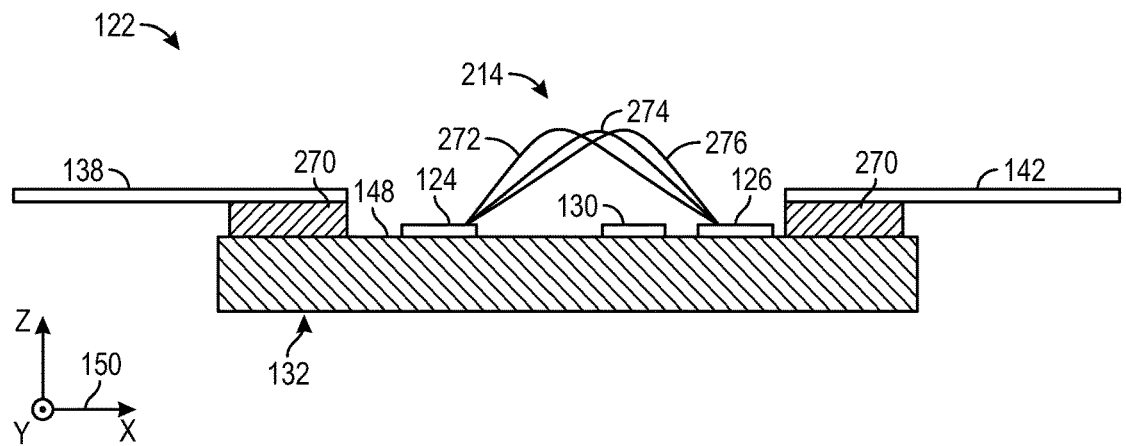
FIG. 6 is a simplified cross-sectional schematic of the Doherty PA package shown in FIGS. 2-5 illustrating one manner in which bond wires contained in the IPD-to-IPD bond wire fence may be imparted with a range of bond wire profiles for enhanced isolation performance in at least some embodiments.

Turning to FIG. 5, the illustrated cross-section is taken through intermediate isolation region 186 of substrate or die body 188 of multi-path IPD die 126, which has an upper principal surface or frontside 236 and a lower principal surface or backside 238. As was previously the case, landing pad 210 is defined by an opening formed in an outer dielectric (e.g., solder mask) layer 240, which exposes a region of a patterned feature 242 formed in an electrically-conductive (e.g., metal) layer 244. Extending from frontside 236 to backside 238, TSVs 246 are again formed through die body 188 to electrically connect feature 242 to base flange 132 and, therefore, landing pad 218 to electrical ground during operation of Doherty PA package 122. Various other features may also be formed in, and extend longitudinally through, intermediate isolation region 186 of multi-path IPD die 126 in embodiments. Such features may be non-essential to the functioning of wire fence 214, but are formed in both IPD regions 182, 184 and thus conveniently extend through or span intermediate isolation region 186. In the illustrated example, these features include a shunt (e.g., high value) capacitor 248 and a shunt metal-oxide-semiconductor (MOS) capacitor structure 250. Shunt capacitor 248 is defined by a patterned metal feature (upper plate) 252 formed as part of upper metal layer 244, an intervening dielectric region 254, a lower metal feature (lower plate) 256 formed as part of a patterned metal level 258, and a number of TSVs 260. Comparatively, MOS capacitor structure 250 is defined by a patterned metal feature (upper plates) 262 formed as part of upper metal layer 244, an intervening dielectric region 264, lower metal features (lower plate grid) 266 formed as part of patterned metal level 258, and a group or farm of TSVs 268. Again, shunt capacitor 248 and MOS capacitor structure 250 may be omitted from multi-path IPD die 126 or, at minimum, may not be formed through intermediate isolation region 186 of die 126 in further implementations. In still other realizations, any or all of the above-described capacitors (e.g., capacitors 248, 250) may be discrete capacitors coupled to the top surface of the multi-path IPDs (e.g., multi-path IPDs 124, 126). More generally, the circuit features formed in multi-path IPD dies 124, 126 can also vary in embodiments in conjunction with variations to wire fence 214.

In embodiments, the isolation performance of grounded wire fence 214 may be enhanced by imparting the bond wires of fence 214 with varying profiles. This may be more fully appreciated by referring to FIG. 6, which is a cross-sectional view through Doherty PA package 122 (shown in a simplified form with various components hidden from view). In this view, it can be seen that package sidewalls 270 (e.g., molded walls or window frame portions) extend vertically between package leads 138, 142 and base flange 132. In this example, at least three bond wires 272, 274, 276 are included in grounded wire fence 214, with each bond wire following a different bond wire profile as viewed along an axis (corresponding to the Y-axis of coordinate legend 150) parallel to frontside 148 of base flange 132 and perpendicular to the axis along which multi-path IPD dies 124, 126 are spaced (corresponding to the X-axis of coordinate legend 150). In particular, bond wires 272, 276 are formed such that the apex of bond wire 272 is located closed to input multi-path IPD die 124 than to output multi-path IPD die 126, while the apex of bond wire 276 is located closer to output multi-path IPD die 126 than to input multi-path IPD 124. Bond wire 274 follows a blended or intermediate path such that the apex of wire 274 is located between the apexes of bond wires 272, 276. In embodiments, bond wire 272 may follow at least a portion of the general shape profile of the gate bond wires connecting to the input (gate) terminals of one or both of FETs 178, 180 (as included in bond wires 172, 176 identified in FIG. 3), while bond wire 276 follows at least a portion of the shape profile of the drain bond wires connecting to the input (gate) terminals of one or both of FETs 178, 180 (as included in bond wires 176, 200 further identified in FIG. 3). Shaping bond wires 272, 274, 276 in this manner can favorably optimize or enhance the shielding capabilities of grounded wire fence 214. This notwithstanding, bond wires 272, 274, 276 may have similar or identical bond wire profiles in further implementations of Doherty PA package 122.

There has thus been described an example implementation of a small footprint Doherty PA package containing two multi-path IPD dies, as well as an IPD-to-IPD isolation structure in the form of a grounded wire fence. In further implementations, a Doherty PA package may be produced to contain one or more multi-path IPDs, while differing from the example Doherty PA package shown in FIGS. 2-6 in various respects. For example, as noted above, the Doherty PA package may contain only a single multi-path IPD die located on the output or input side of the package in alternative implementations. Additionally or alternatively, a multi-path IPD die can be fabricated to include three or more electrically-isolated IPD regions in embodiments in which the Doherty PA package is imparted with an N-way Doherty amplifier topology (N>2). In other embodiments, the multi-path IPDs may be produced on discrete substrate, which may be semiconductor dies, ceramic substrates, or other substrates. As a still further possibility, two multi-path IPDs may be formed in a common substrate in alternative embodiments, rather than in discrete semiconductor dies as was the case in the example embodiment just described. In this latter case, input and output multi-path IPDs may be fabricated on different sections of a PCB embedded in the Doherty PA package. To further emphasized this point, an example of such a Doherty PA package containing a PCB on which input and output multi-path IPDs are produced will now be described in conjunction with FIG. 7.

Figure 7:
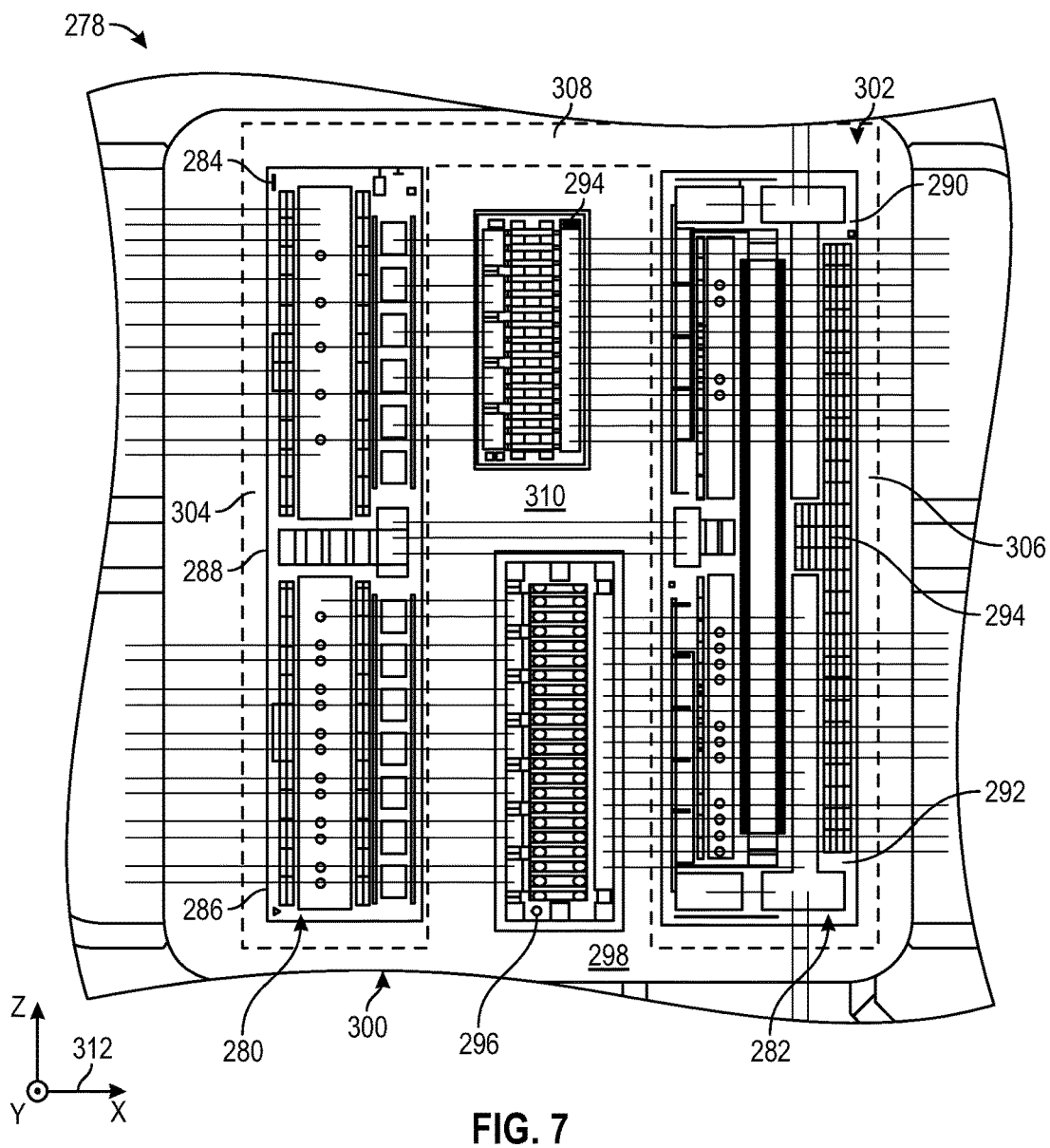
FIG. 7 is a top-down view of a central region of an example Doherty PA package similar to the Doherty PA package shown in FIGS. 2-5, but containing two multi-path IPDs realized utilizing circuitry formed on a different sections of a PCB (rather than discrete dies or other discrete substrates) embedded in the package body.

Advancing lastly to FIG. 7, a central region of an example Doherty PA package 278 is shown. In many respects, Doherty PA package 278 is similar, if not identical to Doherty PA package 122 described above in connection with FIGS. 2-6, with particular attention directed to the central portion of Doherty PA package 122 shown in FIG. 3 for comparison. Accordingly, the above-described structural features shared by Doherty PA packages 122, 278 will not be discussed again in detail to avoid redundancy. As was previously the case, Doherty PA package 278 includes an input multi-path IPD 280 and an output multi-path IPD 282. Input multi-path IPD 280 includes, in turn, a carrier input IPD region 284, a peaking input IPD region 286, and an intermediate isolation region 288 between IPDs regions 284, 286. So too does output multi-path IPD 282 include a carrier output IPD region 288, a peaking output IPD region 290, and an intermediate isolation region 292 between regions 288, 290. Various bond wires (not labeled) interconnect the circuitry elements formed in IPD regions 284, 286, 288, 290 to the FETs carried by a carrier amplifier die 294 and a peaking amplifier die 296 in a manner similar, if not substantially identical to that previously described. Again, the circuitry formed in IPD regions 284, 286, 288, 290 provides input and output impedance matching usefully (although non-essentially) along with other functions, such as harmonic termination, baseband decoupling (e.g., provided by the circuitry formed in IPD regions 288, 290 in combination with additional circuitry external to Doherty PA package 278), and/or gate or drain biasing (only drain biasing circuitry shown in the illustrated example). Amplifier dies 294, 296 are attached to a frontside 298 of a base flange 300, which may serve as an electrically-conductive (e.g., ground) terminal and/or heatsink of Doherty PA package 278.

In contrast to input IPD regions 154, 156 and output IPD regions 182, 184 of Doherty PA package 122 (FIGS. 2-6), input IPD regions 284, 286 and output IPD regions 290, 292 of Doherty PA package 278 are not implemented utilizing separate or discrete substrates (e.g., separate semiconductor dies or ceramic substrates). Instead, input IPD regions 284, 286 and output IPD regions 290, 292 are formed in different portions or sections of a PCB 302, which is embedded in the body of Doherty PA package 122. More specifically, input IPD regions 284, 286 are formed in a first elongated section or wing 304 of PCB 302, while output IPD regions 290, 292 are formed in a second elongated section or wing 306 of PCB 302. PCB wings 304, 306 are joined by an intermediate section 308 and separated or spaced by an opening 310 formed in PCB 302. This imparts PCB 302 with a generally U-shaped geometry, as seen looking downwardly onto PCB 302 along the package centerline (parallel to the Z-axis of coordinate legend 312 shown in the lower left of FIG. 7). Opening 310 further enables direct attachment or bonding of power amplifier dies 294, 296 to frontside 298 of base flange 300. Concurrently, formation of IPD regions 284, 286 and regions 290, 292 on PCB wings 304, 306 provides the desired alignment with power amplifier dies 294, 296; that is, such that carrier input IPD region 284 and carrier output IPD region 290 align with carrier amplifier die 294, while peaking input IPD region 286 and peaking output IPD region 292 align with peaking amplifier die 296, as taken along axes parallel to the Z-axis of coordinate legend 312. By virtue of this arrangement, the die count of Doherty PA package 278 is reduced further (to two), while the above-described benefits relating to lowered manufacturing costs, increased isolation performance, and reduced package size are still achieved in embodiments. In still further implementations, PCB 302 may have a different planform shape (e.g., intermediate section 308 of PCB 302 may be repeated near a lower region of FIG. 7 to impart PCB 302 with a ring shape); or PCB 302 may be divided into two separate PCB via elimination of intermediate section 308. In other implementations, the above-described circuit elements (e.g., capacitors) in such PCB-based multi-path IPDs can be implemented utilizing Surface Mount Devices (SMDs), such as SMD capacitors or "chip caps" coupled to the top surface of the PCBs.

CONCLUSION

There has thus been provided PA packages, such as Doherty PA packages and other PA packages (e.g., push-pull power amplifier packages), containing multi-path IPDs and other associated structural features. Through the incorporation of such multi-path IPDs, the above-described PA packages can boost manufacturing throughput, while reducing manufacturing variation to lower overall production costs. Concurrently, embodiments of the PA packages can be imparted with reduced footprints, while further improving isolation characteristic in embodiments in which an in-package isolation feature is incorporated into the PA package and coupled to one or more multi-path IPDs. For example, improved EM isolation or shielding between the signal paths may be achieved through the provision of a grounded wire fence, which extends between (and may be electrically coupled to a ground terminal of the package), through an input multi-path IPD and an output multi-path IPD. In such embodiments, the bond wires of the wire fence may be imparted with varying wire profiles to provide still further EM isolation enhancements. When containing two or more multi-path IPDs, a Doherty PA package may further contain a PCB on which the multi-path IPDs are formed. Alternatively, each multi-path IPD may be formed on a discrete substrate (e.g., a ceramic substrate or semiconductor die), which is attached to a base flange or other package substrate at a location adjacent the power amplifier dies. A compact, cost effective, high performance Doherty PA package results.

Various embodiments of the above-described (e.g., Doherty) PA package include a package body through a first (e.g., carrier) signal amplification path and a second (e.g., peaking) signal amplification path extend, a first (e.g., carrier) amplifier die within the package body and positioned in the first signal amplification path, and a second (e.g., peaking) amplifier die within the package body and positioned in the second signal amplification path. A multi-path IPD is further contained in the package body and includes: (i) a first (e.g., carrier) IPD region through which the first signal amplification path extends, the first IPD region formed in a IPD substrate at a first location a second IPD region through which the second signal amplification path extends; (ii) a second (e.g., peaking) IPD region, the second IPD region formed in the IPD substrate at a second location spaced from the first location along a second axis perpendicular to the first axis; and (iii) an isolation region formed in the IPD substrate at a third location between or intermediate the first location and the second location.

In further embodiments, the PA package includes a package substrate, a first (e.g., carrier) amplifier die bonded to a frontside the package substrate, and a second (e.g., peaking) amplifier die bonded to the frontside of the package substrate and spaced from the first amplifier die by an amplifier die gap, as taken along a first axis extending parallel to the frontside of the package substrate. An input multi-path IPD is provided having a first (e.g., carrier) input IPD region, a second (e.g., peaking) input IPD region, and a first isolation region between the first input IPD region and the second input IPD region. Similarly, an output multi-path IPD is provided having a first (e.g., carrier) output IPD region, a second (e.g., peaking) output IPD region, and a second isolation region between the first output IPD region and the second output IPD region. An isolation structure extends from the first isolation region, over the amplifier die gap, and to the second isolation region. The isolation structure is electrically coupled to the package substrate through at least one of the first multi-path IPD and the second multi-path IPD.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like have been used above in accordance with the order in which certain elements (e.g., package leads, transistors, and transistor-carrying die) were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:

1. A power amplifier (PA) package, comprising:
a package body through which a first signal amplification path and a second signal amplification path extend;
a first amplifier die contained within the package body and positioned in the first signal amplification path;
a second amplifier die contained within the package body and positioned in the second signal amplification path, the second amplifier die spaced from the first amplifier die along a first axis; and
a multi-path integrated passive device (IPD) further contained within the package body, the multi-path IPD comprising:
an IPD substrate;
a first IPD region through which the first signal amplification path extends, the first IPD region formed in the IPD substrate at a first location;
a second IPD region through which the second signal amplification path extends, the second IPD region formed in the IPD substrate at a second location spaced from the first location along a second axis parallel to the first axis; and
an isolation region formed in the IPD substrate at a third location intermediate the first location and the second location.

2. The PA package of claim 1, wherein the first signal amplification path, the first amplifier die, and the first IPD region comprise a carrier signal amplification path, a carrier amplifier die, and a carrier IPD region, respectively; and
wherein the second signal amplification path, the second amplifier die, and the second IPD region comprise a peaking signal amplification path, a peaking amplifier die, and a peaking amplifier region, respectively.

3. The PA package of claim 2, wherein the IPD substrate spans a space between the carrier signal amplification path and the peaking signal amplification path.

4. The PA package of claim 1, further comprising an electromagnetic (EM) isolation structure coupled to the isolation region and extending from the multi-path IPD over an area between the first amplifier die and the second amplifier die.

5. The PA package of claim 4, wherein the EM isolation structure comprises a wire fence including a plurality of bond wires contacting one or more bond pads located in the isolation region of the multi-path IPD.

6. The PA package of claim 5, further comprising an electrically-conductive flange to which the first amplifier die, the second amplifier die, and the IPD substrate are attached;
wherein the wire fence is electrically coupled to the electrically-conductive flange through the multi-path IPD.

7. The PA package of claim 5, wherein the first amplifier die has a gate terminal and a drain terminal;
wherein the PA package further comprises:
gate bond wires contacting the gate terminal and having a gate bond wire profile; and
drain bond wires contacting the drain terminal and having a drain bond wire profile; and
wherein the plurality of bond wires included in the wire fence comprises:
a first bond wire having a first bond wire profile following at least a portion of the gate bond wire profile, as viewed along a third axis that is perpendicular to the second axis; and
a second bond wire having a second bond wire profile different than the first bond wire profile and following at least a portion of the drain bond wire profile, as viewed along the axis.

8. The PA package of claim 1, further comprising:
a first plurality of bond wires contacting the first IPD region; and
a second plurality of bond wires contacting the second IPD region;
wherein the first IPD region comprises circuitry combining with the first plurality of bond wires to form a first impedance matching network electrically coupled to a terminal of the first amplifier die; and
wherein the second IPD region comprises circuitry combining with the second plurality of bond wires to form a second impedance matching network electrically coupled to a terminal of the second amplifier die.

9. The PA package of claim 8, further comprising a package substrate to which the first amplifier die, the second amplifier die, and the IPD substrate are attached;
wherein the circuitry included in the first IPD region comprises a first shunt capacitor electrically coupled to the package substrate; and
wherein the circuitry included in the second IPD region comprises a second shunt capacitor electrically coupled to the package substrate.

10. The PA package of claim 9, wherein the package substrate comprises an electrically-conductive base flange serving as a ground terminal of the PA package.

11. The PA package of claim 1, further comprising:
a first bond wire contacting the first IPD region; and
a second bond wire contacting the second IPD region;
wherein the first IPD region comprises circuitry combining with the first bond wire to form a first harmonic termination circuit electrically coupled to a terminal of the first amplifier die; and
wherein the second IPD region comprises circuitry combining with the second bond wire to form a second harmonic termination circuit electrically coupled to a terminal of the second amplifier die.

12. The PA package of claim 11, wherein the circuitry of the first IPD region comprises a shunt capacitor, which combines with the first bond wire to form an LC circuit tuned to resonate at a harmonic frequency during operation of the PA package.

13. The PA package of claim 1, wherein the IPD substrate comprises a multi-path IPD semiconductor die located adjacent and extending substantially parallel to the first amplifier die and the second amplifier die.

14. The PA package of claim 1, wherein the IPD substrate comprises a printed circuit board (PCB) embedded in the package body.

15. The PA package of claim 14, further comprising a package substrate to which the first amplifier die, the second amplifier die, and the PCB are attached;
wherein the PCB further comprises an opening through which the first amplifier die and the second amplifier die are bonded to an upper surface of the package substrate.

16. A power amplifier (PA) package, comprising:
a package substrate;
a first amplifier die bonded to a frontside the package substrate;
a second amplifier die bonded to the frontside of the package substrate and spaced from the first amplifier die by an amplifier die gap, as taken along a first axis extending parallel to the frontside of the package substrate;
an input multi-path integrated passive device (IPD) having a first input IPD region, a second input IPD region, and a first isolation region between the first input IPD region and the second input IPD region;
an output multi-path IPD having a first output IPD region, a second output IPD region, and a second isolation region between the first output IPD region and the second output IPD region; and
an isolation structure extending from the first isolation region, over the amplifier die gap, and to the second isolation region, the isolation structure electrically coupled to the package substrate through at least one of the first multi-path IPD and the second multi-path IPD.

17. The PA package of claim 16, wherein the input multi-path IPD comprises an input multi-path IPD die in which the first input IPD region, the second input IPD region, and the first isolation region are formed; and
wherein the output multi-path IPD comprises an output multi-path IPD die in which the first output IPD region, the second output IPD region, and the second isolation region are formed.

18. The PA package of claim 16, wherein input multi-path IPD die extends substantially parallel to the output multi-path IPD die to define an inter-IPD gap in which the second amplifier die and the first amplifier die are located.

19. The PA package of claim 16, further comprising:
a package body partially formed by the package substrate, the package body containing the second amplifier die, the first amplifier die, the input multi-path IPD, and the output multi-path IPD; and
a printed circuit board (PCB) embedded within the package body, the PCB comprising:
a first PCB section on which the input multi-path IPD is formed;
a second PCB section on which the output multi-path IPD is formed; and
an opening located between the first PCB section and the second PCB section, the first amplifier die and the second amplifier die bonded to the package substrate within the opening.

20. The PA package of claim 16, wherein the first input IPD region, the first amplifier die, and the first output IPD region align along a second axis parallel to the first axis and extending parallel to the frontside of the package substrate; and
wherein the second input IPD region, the second amplifier die, and the first output IPD region align along a third axis parallel to the second axis.

\* \* \* \* \*